United States Patent
Halls et al.

(10) Patent No.: US 8,735,871 B2
(45) Date of Patent: May 27, 2014

(54) ORGANIC THIN FILM TRANSISTORS

(75) Inventors: Jonathan J. Halls, Cambridge (GB); Gregory Lewis Whiting, Mountain View, CA (US); Craig Murphy, Teddington (GB); Kaname Ito, Osaka (JP)

(73) Assignees: Cambridge Display Technology Limited, Cambridgeshire (GB); Panasonic Corporation, Osaka (JP)

( * ) Notice: Subject to any disclaimer, the term of this patent is extended or adjusted under 35 U.S.C. 154(b) by 455 days.

(21) Appl. No.: 12/935,573

(22) PCT Filed: Feb. 25, 2009

(86) PCT No.: PCT/EP2009/052227
§ 371 (c)(1),
(2), (4) Date: Jan. 27, 2011

(87) PCT Pub. No.: WO2009/121672
PCT Pub. Date: Oct. 8, 2009

(65) Prior Publication Data
US 2011/0127504 A1 Jun. 2, 2011

(30) Foreign Application Priority Data
Apr. 3, 2008 (GB) .................................. 0806067.5

(51) Int. Cl.
*H01L 35/24* (2006.01)

(52) U.S. Cl.
USPC ................................... 257/40; 257/E51.001

(58) Field of Classification Search
USPC ........................................... 257/40, E51.001
See application file for complete search history.

(56) References Cited

U.S. PATENT DOCUMENTS

| | | | |
|---|---|---|---|
| 5,347,144 A | 9/1994 | Garnier et al. |
| 6,265,243 B1 | 7/2001 | Katz et al. |
| 7,279,777 B2 | 10/2007 | Bai et al. |
| 2004/0219460 A1 | 11/2004 | Bernds et al. |
| 2005/0104058 A1 | 5/2005 | Veres et al. |
| 2005/0127355 A1 | 6/2005 | Jeong et al. |
| 2006/0151781 A1 | 7/2006 | Kim et al. |
| 2007/0075308 A1 | 4/2007 | Dotz et al. |
| 2007/0194305 A1 | 8/2007 | Kim et al. |
| 2007/0296047 A1 | 12/2007 | Kretz et al. |

(Continued)

FOREIGN PATENT DOCUMENTS

| | | |
|---|---|---|
| EP | 1 679 754 A1 | 7/2006 |
| EP | 1 737 027 A1 | 12/2006 |

(Continued)

OTHER PUBLICATIONS

Park et al., "Cooperative Polymer Gate Dielectrics in Organic Thin-Film Transistors," *Appl. Phys. Lett.*, 85(12):2283-2285 (2004).

(Continued)

*Primary Examiner* — Anthony Ho
(74) *Attorney, Agent, or Firm* — Marshall, Gerstein & Borun LLP

(57) ABSTRACT

An organic thin film transistor comprising: a substrate; a source electrode and a drain electrode disposed over the substrate with a channel region therebetween; a layer of organic semiconductor disposed in the channel region; a gate electrode; and a gate dielectric disposed between the layer of organic semiconductor and the gate electrode, wherein the gate dielectric comprises a cross-linked polymer and a fluorine containing polymer.

21 Claims, 2 Drawing Sheets

(56) References Cited

U.S. PATENT DOCUMENTS

| | | |
|---|---|---|
| 2008/0237581 A1 | 10/2008 | Wu et al. |
| 2008/0242112 A1 | 10/2008 | Wu et al. |
| 2010/0078642 A1 | 4/2010 | Tano et al. |

FOREIGN PATENT DOCUMENTS

| | | |
|---|---|---|
| EP | 1 978 572 A2 | 10/2008 |
| JP | 2005-513788 A | 5/2005 |
| JP | 2005-310962 A | 11/2005 |
| JP | 2006-191115 A | 7/2006 |
| JP | 2008-258609 A | 10/2008 |
| JP | 2008-258610 A | 10/2008 |
| WO | WO-2004/100281 A1 | 11/2004 |
| WO | WO-2005/076386 A1 | 8/2005 |
| WO | WO-2006/010469 A1 | 2/2006 |
| WO | WO-2007/023272 A1 | 3/2007 |
| WO | WO-2007/136351 A1 | 11/2007 |

OTHER PUBLICATIONS

International Preliminary Report on Patentability for Application No. PCT/EP2009/052227, dated Jul. 9, 2010.

International Search Report and Written Opinion for Application No. PCT/EP2009/052227, dated Jul. 23, 2009.

Search Report for Application No. GB0806067.5, dated Jun. 28, 2010.

Office Action for corresponding Japanese Patent Application No. 2011-502312, dated Aug. 20, 2013 (Partial English Translation).

Combined Search and Examination Report for Application No. GB 0806067.5, dated Jun. 30, 2008.

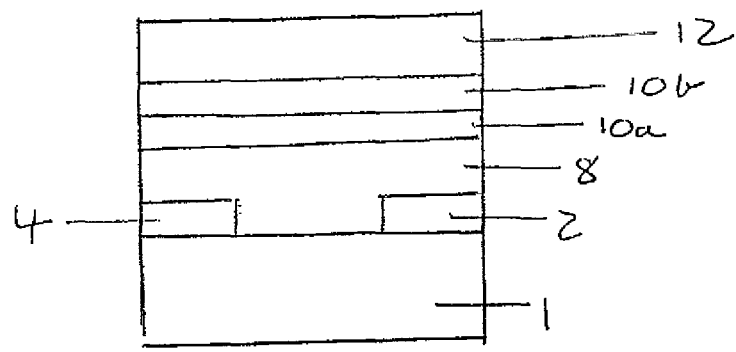
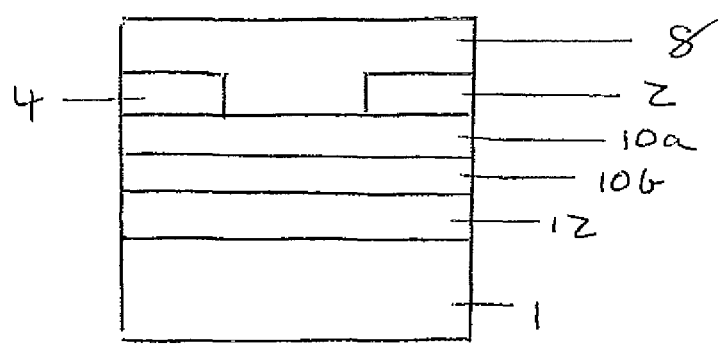

200
ORGANIC THIN FILM TRANSISTORS

FIELD OF INVENTION

The present invention relates to organic thin film transistors.

BACKGROUND OF THE INVENTION

Transistors can be divided into two main types: bipolar junction transistors and field-effect transistors. Both types share a common structure comprising three electrodes with a semi-conductive material disposed therebetween in a channel region. The three electrodes of a bipolar junction transistor are known as the emitter, collector and base, whereas in a field-effect transistor the three electrodes are known as the source, drain and gate. Bipolar junction transistors may be described as current-operated devices as the current between the emitter and collector is controlled by the current flowing between the base and emitter. In contrast, field-effect transistors may be described as voltage-operated devices as the current flowing between source and drain is controlled by the voltage between the gate and the source.

Transistors can also be classified as p-type and n-type according to whether they comprise semi-conductive material which conducts positive charge carriers (holes) or negative charge carriers (electrons) respectively. The semi-conductive material may be selected according to its ability to accept, conduct, and donate charge. The ability of the semi-conductive material to accept, conduct, and donate holes or electrons can be enhanced by doping the material. The material used for the source and drain electrodes can also be selected according to its ability to accept and inject holes or electrodes. For example, a p-type transistor device can be formed by selecting a semi-conductive material which is efficient at accepting, conducting, and donating holes, and selecting a material for the source and drain electrodes which is efficient at injecting and accepting holes from the semi-conductive material. Good energy-level matching of the Fermi-level in the electrodes with the HOMO level of the semi-conductive material can enhance hole injection and acceptance. In contrast, an n-type transistor device can be formed by selecting a semi-conductive material which is efficient at accepting, conducting, and donating electrons, and selecting a material for the source and drain electrodes which is efficient at injecting electrons into, and accepting electrons from, the semi-conductive material. Good energy-level matching of the Fermi-level in the electrodes with the LUMO level of the semi-conductive material can enhance electron injection and acceptance.

Transistors can be formed by depositing the components in thin films to form thin film transistors. When an organic material is used as the semi-conductive material in such a device, it is known as an organic thin film transistor (OTFT). OTFTs may be manufactured by low cost, low temperature methods such as solution processing. Moreover, OTFTs are compatible with flexible plastic substrates, offering the prospect of large-scale manufacture of OTFTs on flexible substrates in a roll-to-roll process.

Various arrangements for organic thin film transistors are known. One such device is an insulated gate field-effect transistor which comprises source and drain electrodes with a semi-conductive material disposed therebetween in a channel region, a gate electrode disposed adjacent the semi-conductive material and a layer of insulating material disposed between the gate electrode and the semi-conductive material in the channel region.

An example of such an organic thin film transistor is shown in FIG. 1. The illustrated structure may be deposited on a substrate 1 and comprises source and drain electrodes 2, 4 which are spaced apart with a channel region located therebetween. An organic semiconductor (OSC) 8 is deposited in the channel region and may extend over at least a portion of the source and drain electrodes 2, 4. An insulating layer 10 of dielectric material is deposited over the organic semi-conductor 8 and may extend over at least a portion of the source and drain electrodes 2, 4. Finally, a gate electrode 12 is deposited over the insulating layer 10. The gate electrode 12 is located over the channel region and may extend over at least a portion of the source and drain electrodes 2, 4.

The structure described above is known as a top-gate organic thin film transistor as the gate is located on a top side of the device. If source/drain contacts are located under the OSC layer the device may be more completely described as a top gate, bottom contact device. Top gate, top contact devices are also possible, with the source/drain contacts located over the OSC.

Alternatively, it is also known to provide the gate on a bottom side of the device to form a so-called bottom-gate organic thin film transistor.

An example of such a bottom-gate organic thin film transistor is shown in FIG. 2. In order to show more clearly the relationship between the structures illustrated in FIGS. 1 and 2, like reference numerals have been used for corresponding parts. The bottom-gate structure illustrated in FIG. 2 comprises a gate electrode 12 deposited on a substrate 1 with an insulating layer 10 of dielectric material deposited thereover. Source and drain electrodes 2, 4 are deposited over the insulating layer 10 of dielectric material. The source and drain electrodes 2, 4 are spaced apart with a channel region located therebetween over the gate electrode. An organic semiconductor (OSC) 8 is deposited in the channel region and may extend over at least a portion of the source and drain electrodes 2, 4.

If the source/drain contacts are located under the OSC layer, the device may be more completely described as a bottom gate, bottom contact device. Bottom gate, top contact devices are also possible, with the source/drain contacts located over the OSC.

The conductivity of the channel can be altered by the application of a voltage at the gate. In this way the transistor can be switched on and off using an applied gate voltage.

The dielectric layer comprises a dielectric material selected from insulating materials having a high resistivity. The dielectric constant, k, of the dielectric is typically around 2-3 although materials with a high value of k are in principle desirable because the capacitance that is achievable for an OTFT is directly proportional to k, and the drain current $I_D$ is directly proportional to the capacitance. However, research has also shown that in many cases the properties of the OTFT is improved with lower k dielectric materials, as is the case with the fluorinated materials discussed below.

The drain current that is achievable for an organic thin film transistor is inversely proportional to the thickness of the dielectric in the active region of the device (channel between source and drain electrodes). Thus, in order to achieve high drain currents with low operational voltages, organic thin film transistors must have thin dielectric layers in the channel region.

It is apparent from the above that the dielectric in an organic thin film transistor, and the interface it forms with the OSC, is an important factor in determining the operating characteristics of the organic thin film transistor. As such, various materials and structures for the dielectric have been proposed in the prior art.

U.S. Pat. No. 6,265,243, which was published in 2001, discloses an OTFT in which the dielectric is surface-treated with a fluorinated organic material such as a fluorinated silane. Suitable materials for the dielectric are given as silicon dioxide, polyimide, and polyvinylphenol (PVP). It is also disclosed that as an alternative to treating the dielectric surface with fluorinated organic material such as fluorinated silane, the dielectric material may be replaced with a dielectric polymeric material rich in fluoroalkyl chains. No examples appear to be given for this alternative dielectric polymeric material.

Applied Physics Letters, vol. 85, no. 12, p 2283 (2004) describes a bilayer dielectric. This document describes using a bilayer comprising PVP and polyvinyl acetate as the two layers.

U.S. Pat. No. 7,279,777, which was published in 2007 and refers to the previously mentioned document U.S. Pat. No. 6,265,243 in its background section, discloses substantially non-fluorinated cyano-functional polymers for the dielectric layer which preferably include a crosslinkable group. Various non-fluorinated styrene-containing surface modifying polymers are also disclosed for use with the non-fluorinated cyano-functional polymers. It is described that much higher mobilities are achieved than for the fluorinated dielectrics disclosed in U.S. Pat. No. 6,265,243.

It is one aim of embodiments of the present invention to provide a solution to one or more of the problems discussed above.

SUMMARY OF INVENTION

The present applicant has determined that there are a number of physical, chemical, and electrical characteristics which it would be advantageous for an OTFT gate dielectric to possess.

In terms of physical characteristics, it would be advantageous for the dielectric to be thin in order to achieve high drain currents with low operational voltages while also providing a robust, continuous layer with no pin-hole defects, have low permeability to air, moisture, and other chemical contaminants, and provide a good, defect free interface with the organic semiconductor of the OTFT. It would also be advantageous for the dielectric to provide good adhesion to the gate to prevent delamination while also providing a low contact angle surface for the organic semiconductor in order to prevent pinning of organic semiconductor molecules to the surface such that they are more free to crystallize increasing mobility. Furthermore, it would be advantageous for the dielectric to be readily deposited to form a film having the aforementioned characteristics without damaging underlying layers.

In terms of chemical characteristics, it would be advantageous for the dielectric to be chemically inert with respect to air, moisture, and other chemical contaminants, and also provide no chemical contamination of the organic semiconductor of the OTFT.

In terms of electrical characteristics, it would be advantageous for the dielectric to have a high resistivity in order to prevent current leakage and a high dielectric constant k to maintain high gate capacitance and achieve high drain currents. At the same time, it would be advantageous for the dielectric to have a low k surface at the interface with the organic semiconductor as it has been found that low k dielectrics improve the morphology of the organic semiconductor and have a reduced number of charge traps compared to high k dielectric surfaces.

Having identified the numerous advantageous characteristics which it would be desirable for a dielectric to possess, the present applicant has assessed the prior art arrangements and come to the conclusions that none of the prior art arrangements fully address all the desired requirements. The best dielectrics disclosed in the prior art discussed in the background section would appear to be those disclosed in U.S. Pat. No. 7,279,777. As previously indicated in the background section, these comprise substantially non-fluorinated cyano-functional polymers for the dielectric layer which preferably include a crosslinkable group. Various non-fluorinated styrene-containing surface modifying polymers are also disclosed for use with the non-fluorinated cyano-functional polymers. It is described that much higher mobilities are achieved than for the fluorinated dielectrics disclosed in U.S. Pat. No. 6,265,243.

The present applicant has realized that the preferred crosslinkable polymers disclosed in U.S. Pat. No. 7,279,777 would meet many of the desired criteria they have identified.

Cross linkable polymers generally have a higher degree of physical, chemical and thermal robustness than non-cross linked materials. Although they can be readily processed from solution, cross linking renders the layer insoluble to further solvent exposure. Cross linked polymers may in some cases also have good insulating qualities.

The fluorinated dielectrics disclosed in U.S. Pat. No. 6,265,243 also possess many of the desirable characteristics. As such, one possibility that the present applicant has considered is to combine the teachings of these documents such that the crosslinkable polymers disclosed in U.S. Pat. No. 7,279,777 are provided with a fluorinated silane surface treatment. However, the present applicant has realized that even with this modification, all the desired requirements are not fully met. Instead, the present applicant has realized that it would be better to combine the advantageous properties of crosslinked polymers, such as those disclosed in U.S. Pat. No. 7,279,777, with the advantageous properties of fluorinated polymers.

Fluorinated polymers are more readily solution processable than the fluorinated silanes disclosed in U.S. Pat. No. 6,265,243 and can be readily deposited from solution by, for example, spin coating or inkjet printing without damaging underlying layers. Fluorinated polymers can be deposited from solvents such as fluorinated solvents which are orthogonal to the solvents that dissolve most organic semiconductors. Accordingly, the organic semiconductor is not re-dissolved when depositing the fluorinated polymer thereover in a top gate structure, leading to a distinct, high quality OSC/dielectric interface. Furthermore, fluorinated polymers provide excellent surface properties providing a better interface with the organic semiconductor. In particular, the lack of polar surface groups, and resistance to water vapour that might induce these, leads to improved OTFT properties.

While U.S. Pat. No. 6,265,243 does mention dielectric polymeric material rich in fluoroalkyl chains, the documents teaches that the dielectric may be replaced with a dielectric polymeric material rich in fluoroalkyl chains as an alternative to treating the dielectric surface with fluorinated silane. As such, this document teaches away from the present applicant's inventive concept of combining the features of a fluorinated polymer with those of a crosslinked polymer.

In light of the above, in accordance with a first aspect of the present invention there is provided an organic thin film transistor comprising: a substrate; a source electrode and a drain electrode disposed over the substrate with a channel region therebetween; a layer of organic semiconductor disposed in the channel region; a gate electrode; and a gate dielectric disposed between the layer of organic semiconductor and the gate electrode, wherein the gate dielectric comprises a cross-linked polymer and a fluorine containing polymer.

The cross-linked polymer and the fluorine containing polymers may be provided in separate layers with the fluorine containing polymer disposed inbetween the layer of organic semiconductor and the cross-linked polymer layer. Preferably the cross-linked polymer layer is thicker than the fluoropolymer layer. However, the thickness of the layers will depend on the dielectric constant of the materials used. Accordingly, in certain embodiments the fluoropolymer layer may be thicker than the cross-linked polymer layer. The fluoropolymer layer may have a layer thickness in the range 50-300 nm. The cross-linked polymer layer may have a layer thickness in the range 100-300 nm.

Alternatively, a single layer comprising both cross-linking and fluorine may be provided. The single layer may have a thickness in the range 50-400 nm. In the single layer embodiment, the cross-linking and fluorine may be provided in separate polymers in a blend or they may be provided in the same polymer, i.e. a cross-linked fluoropolymer. If a separate cross-linked polymer and a separate fluoropolymer are provided, the concentration of the cross-linked polymer and the fluoropolymer may vary through the dielectric with a higher concentration of fluoropolymer adjacent the organic semiconductor. This may be achieved by depositing the polymer from solution in a blend and allowing the polymers to at least partially phase separate as the solvent evaporates. Partial phase separation will result in a single layer with variable concentrations of polymer components. Total phase separation results in two separate layers being formed. Alternatively, the two polymers may be deposited in separate steps, one on top of the other.

The fluoropolymer may have a k value in the range 1.9-2.3.

According to one embodiment, the organic thin film transistor is a bottom gate transistor in which the gate electrode is disposed over the substrate, the gate dielectric is disposed over the gate electrode, and the source and drain electrodes and the layer of organic semiconductor are disposed over the gate dielectric.

According to an alternative embodiment, the organic thin film transistor is a top gate transistor in which the source and drain electrodes are disposed over the substrate, the organic semiconductor is disposed over the source and drain electrodes, the gate dielectric is disposed over the organic semiconductor, and the gate electrode is disposed over the gate dielectric.

The dielectric may also be required to serve as an insulating spacer between rows and columns defined by the gate metallisation and source drain metallisation in, for example, a light-emissive display. In this case the dielectric according to embodiments of the present invention can reduce parasitic capacitance, leakage and the probability of shorts at row/column crossing points. Furthermore, in some regions later metallisation such as a cathode electrode layer in a light-emissive display can be well spaced from metallisation on the substrate by the dielectric of embodiments of the present invention.

In accordance with a second aspect of the present invention there is provided a method of manufacturing a top gate organic thin film transistor, the method comprising: providing a substrate comprising a source electrode and a drain electrode with a channel region therebetween; depositing a layer of organic semiconductor in the channel region; depositing a gate dielectric over the layer of organic semiconductor; and forming a gate electrode over the gate dielectric, wherein the gate dielectric comprises a cross-linked polymer and a fluorine containing polymer.

In accordance with a third aspect of the present invention there is provided a method of manufacturing a bottom gate organic thin film transistor, the method comprising: providing a substrate comprising a gate electrode; depositing a gate dielectric over the gate electrode; forming a source electrode and a drain electrode over the gate dielectric with a channel region therebetween; and depositing a layer of organic semiconductor in the channel region, wherein the gate dielectric comprises a cross-linked polymer and a fluorine containing polymer.

In accordance with fourth aspect of the present invention there is provided an organic thin film transistor comprising: a substrate; a source electrode and a drain electrode disposed over the substrate with a channel region therebetween; a layer of organic semiconductor disposed in the channel region; a gate electrode; and a gate dielectric disposed between the layer of organic semiconductor and the gate electrode, wherein the gate dielectric comprises a cross-linked polymer and a polymer having a dielectric constant k in the range 1.9 to 2.3.

In accordance with a fifth aspect of the present invention there is provided a method of manufacturing a top gate organic thin film transistor, the method comprising: providing a substrate comprising a source electrode and a drain electrode with a channel region therebetween; depositing a layer of organic semiconductor in the channel region; depositing a gate dielectric over the layer of organic semiconductor; and forming a gate electrode over the gate dielectric, wherein the gate dielectric comprises a cross-linked polymer and a polymer having a dielectric constant k in the range 1.9 to 2.3.

In accordance with a sixth aspect of the present invention there is provided a method of manufacturing a bottom gate organic thin film transistor, the method comprising: providing a substrate comprising a gate electrode; depositing a gate dielectric over the gate electrode; forming a source electrode and a drain electrode over the gate dielectric with a channel region therebetween; and depositing a layer of organic semiconductor in the channel region, wherein the gate dielectric comprises a cross-linked polymer and a polymer having a dielectric constant k in the range 1.9 to 2.3.

Embodiments of the second to sixth aspects may have one or more of the features described in relation to embodiments of the first aspect.

BRIEF DESCRIPTION OF THE DRAWINGS

The present invention will now be described in further detail, by way of example only, with reference to the accompanying drawings in which:

FIG. 3 shows a top-gate organic thin film transistor structure according to an embodiment of the present invention; and FIG. 4 shows a bottom-gate organic thin film transistor structure according to an embodiment of the present invention.

DETAILED DESCRIPTION OF THE PREFERRED EMBODIMENTS

Figure 1:
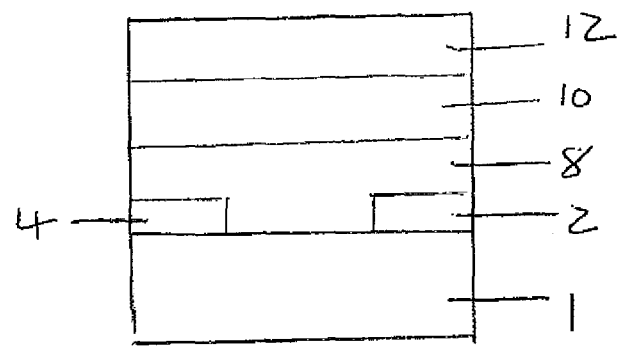
FIG. 1 shows a top-gate organic thin film transistor structure according to a prior art arrangement.

The top-gate organic thin film transistor structure shown in FIG. 3 is essentially the same as that shown in FIG. 1 but with the dielectric comprising a primary dielectric layer 10a adjacent the organic semiconductor 8 and a secondary dielectric layer 10b between the primary dielectric layer 10a and the gate electrode 12. The primary dielectric layer 10a is a fluorine containing polymer and the secondary dielectric layer 10b is a cross-linked polymer.

Figure 2:
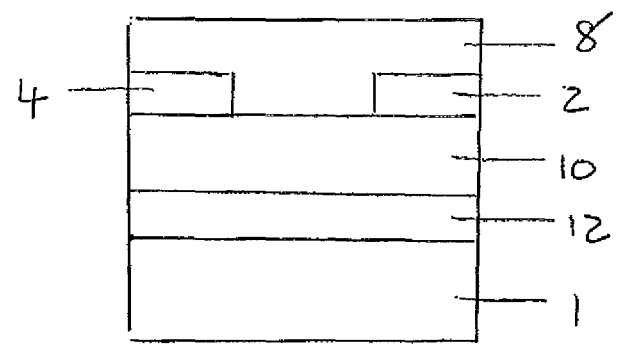
FIG. 2 shows a bottom-gate organic thin film transistor structure according to a prior art arrangement.

Similarly, the bottom-gate organic thin film transistor structure shown in FIG. 4 is essentially the same as that shown in FIG. 2 but with the dielectric comprising a primary dielectric layer 10a adjacent the organic semiconductor 8 and a secondary dielectric layer 10b between the primary dielectric layer 10a and the gate electrode 12. Again, primary dielectric layer 10a is a fluorine containing polymer and the secondary dielectric layer 10b is a cross-linked polymer.

Embodiments of the present invention provide a bi-layer dielectric system for organic TFTs comprising:

1. A primary fluoropolymer dielectric layer in contact with the OSC. The OTFT channel is formed at the interface between the OSC and this low k dielectric layer. The fluoropolymer layer also provides good resistance to moisture and other chemical contaminants (such as the by-products of cross linking of the secondary dielectric layer) and is deposited by orthogonal fluoro-solvents to the OSC.
2. A secondary dielectric layer, between the first dielectric layer and the gate metal. This layer is a cross linked material with excellent thin film insulator properties. This layer reduces gate leakage and improves physical robustness. The second dielectric layer is also chosen to have a higher surface energy than the fluoropolymer, to promote adhesion of the gate metal to the dielectric surface.

Embodiments of the present invention allow the advantages of fluoropolymers (stability, orthogonal solvents, low k) to be combined with those of cross linked materials (high resistivity, robustness). In parallel, the invention mitigates against the disadvantages of fluoropolymer dielectrics (increased gate leakage, poor adhesion to gate) and cross linked materials (interaction of cross linking by-products with the OSC).

Fluoropolymers show great promise as dielectrics for organic TFTs for several reasons:

1. The low k surface leads to improved stability and reduced sensitivity to, for example, ambient moisture that can damage OTFT performance.
2. As fluoropolymers dissolve in fluorinated solvents, which are orthogonal to the solvents that dissolve most OSCs, top gate OTFTs can be readily fabricated without re-dissolving the OSC, leading to a high quality OSC/dielectric interface.
3. Specifically for bottom gate, low k dielectrics can also improve the morphology of OSC materials that are deposited on top of them. The low contact angle surface prevents pinning of OSC molecules to the surface making them more free to crystallise.

However, problems experienced using fluoropolymer dielectrics include:

1. Although fluoropolymers are generally known for their high resistivity, the present applicant has found increased gate leakages when using certain fluorinated dielectrics. This may be a result of pin-holes in the thin-cast fluoropolymer dielectric films, or residual fluoro-solvents remaining from the casting process.
2. The low surface energy of fluoropolymers gives rise to issues of adhesion of the gate metal to the surface of the gate dielectric In contrast, the present applicant has found that cross linked dielectrics typically give rise to reduced gate leakage. Cross linked dielectrics are more commonly used in bottom gate devices, in which the dielectric is processed before OSC deposition. This is, in part, due to the fact that the by-products of the cross linking reaction can damage the OSC if the dielectric is used in a top gate device, and particularly the OSC dielectric interface.

The bi-layer dielectric system of embodiments of the present invention avoids the aforementioned problems while providing all the advantages. A method of forming an OTFT with top gate architecture involves the following steps:

1. OSC is deposited onto a substrate with pre-defined source/drain contacts. The substrate may include a test cell or backplane array. Drying and annealing are carried out as required for the particular OSC.
2. The "primary" dielectric layer is deposited on the OSC by e.g. spin coating or ink jet printing. The primary dielectric is preferably a fluorinated polymer, such as Teflon or CYTOP, deposited from a fluorinated solvent. A drying step may be required to remove the solvent.
3. An intermediate adhesion promotion layer may be included between the secondary and primary dielectrics. An example of such as adhesion promotion layer is PVB (Polyvinyl butyral).
4. The "secondary" dielectric layer is deposited on top of the "primary" dielectric layer. This layer is a cross linked layer, such as a BCB (Benzocyclobutene), cross-linked PVP (cross linked with e.g. dichlorosilanes or poly melamine formaldehyde) or a poly norbonene based system. The primary, fluoropolymer layer protects the OSC from damage caused by the by-products of the cross-linking process. Cross linking may be driven thermally (lower temperatures are preferred to reduce any damage to the OSC and the fluoropolymer dielectric), chemically, or by electro-magnetic radiation, such as UV or IR.
5. The gate metal is deposited on top of the secondary dielectric layer.

In an alternative arrangement, a cross linked fluoropolymer may perform both the functions of the two layers described above. A suitable material is Poly(pentafluorostyrene-co-glycidyl methacrylate:

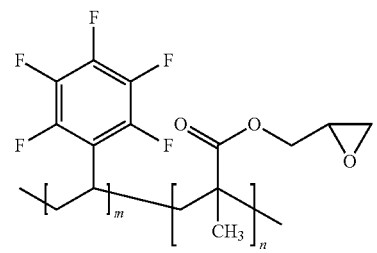

The organic semi-conductive material may be solution processable such that it can be deposited from solution by, for example, spin-coating or ink-jet printing, either directly or in the form of a precursor. The organic semi-conductive material may comprise a polymer, oligomer or dendrimer as these have proved to be good solution processable materials. Small molecule OSC materials such as a soluble pentacene derivative may also be used. Many such semi-conductive materials are known in the art, for example, conjugated polymers utilized in organic light-emissive devices. The OSC may also be deposited by vacuum deposition, as used to deposit pentacene.

The gate electrode can be printed or deposited using other simple patterning techniques which are known in the art.

The bilayer dielectric may be utilised to reduce track leakage between lower and higher level metallization in a device such as a display (e.g. an active matrix organic light-emissive display).

Further details of materials and processes applicable to the invention are set out below.

Substrate

The substrate may be rigid or flexible. Rigid substrates may be selected from glass or silicon and flexible substrates may comprise thin glass or plastics such as poly(ethylene terephthalate) (PET), poly(ethylene-naphthalate) PEN, polycarbonate and polyimide.

The organic semiconductive material may be made solution processable through the use of a suitable solvent. Exemplary solvents include mono- or poly-alkylbenzenes such as toluene and xylene; tetralin; and chloroform. Preferred solution deposition techniques include spin coating and ink jet printing. Other solution deposition techniques include dip-coating; roll printing; and screen printing. In cases where a solution is dispensed from a nozzle, the printing process may be either continuous or discontinuous. For example, in a continuous process a continuous strip of organic semiconductive material may be dispensed from a nozzle, whereas discontinuous drops are dispensed from a nozzle in a discontinuous printing process.

Organic Semiconductor Materials

Preferred organic semiconductor materials include small molecules such as optionally substituted pentacene; optionally substituted polymers such as polyarylenes, in particular polyfluorenes and polythiophenes; and oligomers. Blends of materials, including blends of different material types (e.g. a polymer and small molecule blend) may be used.

Source and Drain Electrodes

For a p-channel OTFT, preferably the source and drain electrodes comprise a high workfunction material, preferably a metal, with a workfunction of greater than 3.5 eV, for example gold, platinum, palladium, molybdenum, tungsten, or chromium. More preferably, the metal has a workfunction in the range of from 4.5 to 5.5 eV. Other suitable compounds, alloys and oxides such as molybdenum trioxide and indium tin oxide may also be used. The source and drain electrodes may be deposited by thermal evaporation and patterned using standard photolithography and lift off techniques as are known in the art. A self assembled monolayer, or other surface treatment, may be applied to the source drain contacts to improve charge injection.

Alternatively, conductive polymers may be deposited as the source and drain electrodes. An example of such a conductive polymers is poly(ethylene dioxythiophene) (PEDOT) although other conductive polymers are known in the art. Such conductive polymers may be deposited from solution using, for example, spin coating or ink jet printing techniques and other solution deposition techniques discussed above.

For an n-channel OTFT, preferably the source and drain electrodes comprise a material, for example a metal having a workfunction of less than 3.5 eV such as calcium or barium or a thin layer of metal compound, in particular an oxide or fluoride of an alkali or alkali earth metal for example lithium fluoride, barium fluoride and barium oxide. Alternatively, conductive polymers may be deposited as the source and drain electrodes.

The source and drain electrodes are preferably formed from the same material for ease of manufacture. However, it will be appreciated that the source and drain electrodes may be formed of different materials for optimisation of charge injection and extraction respectively.

The length of the channel defined between the source and drain electrodes may be up to 500 microns, but preferably the length is less than 200 microns, more preferably less than 100 microns, most preferably less than 20 microns.

Gate Electrode

The gate electrode can be selected from a wide range of conducting materials for example a metal (e.g. gold) or metal compound (e.g. indium tin oxide). Alternatively, conductive polymers may be deposited as the gate electrode. Such conductive polymers may be deposited from solution using, for example, spin coating or ink jet printing techniques and other solution deposition techniques discussed above Thicknesses of the gate electrode, source and drain electrodes may be in the region of 5-200 nm, although typically 50 nm as measured by Atomic Force Microscopy (AFM), for example.

Further Layers

Other layers may be included in the device architecture. For example, a self assembled monolayer (SAM) may be deposited on the gate, source or drain electrodes, substrate, dielectric, or organic semiconductor material to promote crystallity, reduce contact resistance, repair surface characteristics and promote adhesion where required. Exemplary materials for such a monolayer include chloro- or alkoxy-silanes with long alkyl chains, eg octadecyltrichlorosilane.

OTFT Applications

OTFTs according to embodiments of the present invention have a wide range of possible applications. One such application is to drive pixels in an optical device, preferably an organic optical device. OTFTs are particularly suited for use with active matrix organic light emitting devices, e.g. for use in display applications. An organic light-emitting device comprises an anode, a cathode and a layer comprising an organic light-emitting material therebetween that emits light when a potential difference is applied across the anode and the cathode. In addition to the layer of light emitting material, charge transporting or blocking layers, or exciton blocking layers, may be provided between the anode and cathode.

In addition, OTFTs may be used in an active matrix photodetector array, using organic photoresponsive devices. Such an array may be used as an image scanner or X-ray imaging device if used in conjunction with a scintillator material.

Organic thin film transistors according to embodiments of the present invention have many common structural features with organic light-emissive displays and may be formed using similar techniques and materials. For example, the dielectric of the present invention may be formed of the same material as that used for bank structures defining pixels of an organic light-emissive display and may thus be formed as a common layer. As such, according to one advantageous arrangement, the organic thin film transistors and the organic light-emissive pixels of an active matrix organic light-emissive display are formed on a common substrate and the dielectric discussed herein forms the bank structure for the organic light-emissive pixels.

It will be appreciated that pixel circuits comprising an OTFT and an optically active pixel area (e.g. light emitting or light sensing pixel area) may comprise further elements. In particular, an OLED pixel circuit may comprise an OTFT according to the invention as a driving transistor and will typically comprise at least one further (organic or inorganic) transistor in addition to the driving transistor, and at least one capacitor.

While this invention has been particularly shown and described with reference to preferred embodiments thereof, it will be understood by those skilled in the art that various changes in form and detail may be made therein without departing from the scope of the invention as defined by the appended claims.

The invention claimed is:

1. An organic thin film transistor comprising:
a substrate;
a source electrode and a drain electrode disposed over the substrate with a channel region therebetween;
a layer of organic semiconductor disposed in the channel region;
a gate electrode; and
a gate dielectric disposed between the layer of organic semiconductor and the gate electrode, wherein the gate dielectric comprises a cross-linked polymer and a fluorine containing polymer,
wherein the gate dielectric comprises a single layer comprising both the cross-linked polymer and the fluorine containing polymer, and wherein the cross-linked polymer and the fluorine containing polymer are provided as separate polymers.

2. An organic thin film transistor according to claim 1, wherein the cross-linked polymer and the fluorine containing polymer vary in concentration through the gate dielectric with a higher concentration of fluorine containing polymer adjacent the organic semiconductor, the concentration decreasing with increasing distance from the layer of organic semiconductor.

3. An organic thin film transistor according to claim 2, wherein the organic thin film transistor is a bottom gate transistor in which the gate electrode is disposed over the substrate, the gate dielectric is disposed over the gate electrode, and the source and drain electrodes and the layer of organic semiconductor are disposed over the gate dielectric.

4. An organic thin film transistor according to claim 2, wherein the organic thin film transistor is a top gate transistor in which the source and drain electrodes are disposed over the substrate, the organic semiconductor is disposed over the source and drain electrodes, the gate dielectric is disposed over the organic semiconductor, and the gate electrode is disposed over the gate dielectric.

5. An organic thin film transistor according to claim 1, wherein the organic thin film transistor is a bottom gate transistor in which the gate electrode is disposed over the substrate, the gate dielectric is disposed over the gate electrode, and the source and drain electrodes and the layer of organic semiconductor are disposed over the gate dielectric.

6. An organic thin film transistor according to claim 1, wherein the organic thin film transistor is a top gate transistor in which the source and drain electrodes are disposed over the substrate, the organic semiconductor is disposed over the source and drain electrodes, the gate dielectric is disposed over the organic semiconductor, and the gate electrode is disposed over the gate dielectric.

7. A method of manufacturing a top gate organic thin film transistor, the method comprising:
providing a substrate comprising a source electrode and a drain electrode with a channel region therebetween;
depositing a layer of organic semiconductor in the channel region;
depositing a gate dielectric over the layer of organic semiconductor; and
forming a gate electrode over the gate dielectric, wherein the gate dielectric comprises a cross-linked polymer and a fluorine containing polymer,
wherein the gate dielectric comprises a single layer comprising both the cross-linked polymer and the fluorine containing polymer, and
wherein the cross-linked polymer and the fluorine containing polymer are provided as separate polymers.

8. A method according to claim 7, wherein a cross-linkable polymer and the fluorine containing polymer are deposited from solution in a blend.

9. A method according to claim 8, wherein the cross-linkable polymer and the fluorine containing polymer partially phase separate after deposition.

10. A method according to claim 9, wherein the cross-linkable polymer is cross-linked after being deposited to form the cross-linked polymer.

11. A method according to claim 9, wherein the fluorine containing polymer and the organic semiconductor are deposited from orthogonal solvents.

12. A method according to claim 8, wherein the cross-linkable polymer is cross-linked after being deposited to form the cross-linked polymer.

13. A method according to claim 12, wherein the fluorine containing polymer and the organic semiconductor are deposited from orthogonal solvents.

14. A method according to claim 8, wherein the fluorine containing polymer and the organic semiconductor are deposited from orthogonal solvents.

15. A method of manufacturing a bottom gate organic thin film transistor, the method comprising:
providing a substrate comprising a gate electrode;
depositing a gate dielectric over the gate electrode;
forming a source electrode and a drain electrode over the gate dielectric with a channel region therebetween; and
depositing a layer of organic semiconductor in the channel region, wherein the gate dielectric comprises a cross-linked polymer and a fluorine containing polymer,
wherein the gate dielectric comprises a single layer comprising both the cross-linked polymer and the fluorine containing polymer, and
wherein the cross-linked polymer and the fluorine containing polymer are provided as separate polymers.

16. A method according to claim 15, wherein a cross-linkable polymer and the fluorine containing polymer are deposited from solution in a blend.

17. A method according to claim 16, wherein the cross-linkable polymer and the fluorine containing polymer partially phase separate after deposition.

18. A method according to claim 17, wherein the cross-linkable polymer is cross-linked after being deposited to form the cross-linked polymer.

19. An organic thin film transistor comprising:
a substrate;
a source electrode and a drain electrode disposed over the substrate with a channel region therebetween;
a layer of organic semiconductor disposed in the channel region;
a gate electrode; and
a gate dielectric disposed between the layer of organic semiconductor and the gate electrode,
wherein the gate dielectric comprises a cross-linked polymer and a polymer having a dielectric constant k in the range 1.9 to 2.3,
wherein the gate dielectric comprises a single layer comprising both the cross-linked polymer and the polymer having a dielectric constant k in the range 1.9 to 2.3, wherein the cross-linked polymer and the polymer having a dielectric constant k in the range 1.9 to 2.3 are provided as separate polymers, and wherein the polymer having a dielectric constant k in the range 1.9 to 2.3 is a fluorine containing polymer.

20. A method of manufacturing a top gate organic thin film transistor, the method comprising:

providing a substrate comprising a source electrode and a drain electrode with a channel region therebetween;

depositing a layer of organic semiconductor in the channel region;

depositing a gate dielectric over the layer of organic semiconductor; and forming a gate electrode over the gate dielectric, wherein the gate dielectric comprises a cross-linked polymer and a polymer having a dielectric constant k in the range 1.9 to 2.3, wherein the gate dielectric comprises a single layer comprising both the cross-linked polymer and the polymer having a dielectric constant k in the range 1.9 to 2.3, wherein the cross-linked polymer and the polymer having a dielectric constant k in the range 1.9 to 2.3 are provided as separate polymers, and wherein the polymer having a dielectric constant k in the range 1.9 to 2.3 is a fluorine containing polymer.

21. A method of manufacturing a bottom gate organic thin film transistor, the method comprising:

providing a substrate comprising a gate electrode; depositing a gate dielectric over the gate electrode;

forming a source electrode and a drain electrode over the gate dielectric with a channel region therebetween; and depositing a layer of organic semiconductor in the channel region, wherein the gate dielectric comprises a cross-linked polymer and a polymer having a dielectric constant k in the range 1.9 to 2.3, wherein the gate dielectric comprises a single layer comprising both the cross-linked polymer and the polymer having a dielectric constant k in the range 1.9 to 2.3, wherein the cross-linked polymer and the polymer having a dielectric constant k in the range 1.9 to 2.3 are provided as separate polymers, and wherein the polymer having a dielectric constant k in the range 1.9 to 2.3 is a fluorine containing polymer.

* * * * *